United States Patent
Williams et al.

(10) Patent No.: US 12,259,656 B1
(45) Date of Patent: Mar. 25, 2025

(54) METHOD OF FABRICATING STRUCTURED MEMBRANES

(71) Applicant: United States of America as represented by the Administrator of NASA, Washington, DC (US)

(72) Inventors: Elissa Williams, Greenbelt, MD (US); Kevin Denis, Crofton, MD (US); Hsiang-Yu Liu, Lanham, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 272 days.

(21) Appl. No.: 17/951,306

(22) Filed: Sep. 23, 2022

(51) Int. Cl.
*G03F 7/34* (2006.01)
*G03F 7/36* (2006.01)
*B81C 1/00* (2006.01)

(52) U.S. Cl.
CPC ............ *G03F 7/343* (2013.01); *G03F 7/36* (2013.01); *B81C 1/00531* (2013.01)

(58) Field of Classification Search
CPC ........ G03F 7/343; G03F 7/36; B81C 1/00531
See application file for complete search history.

(56) References Cited

U.S. PATENT DOCUMENTS

| | | | |
|---|---|---|---|
| 8,445,324 B2 * | 5/2013 | Qu | H01L 21/76229 438/110 |
| 10,989,604 B1 * | 4/2021 | Denis | G01J 5/20 |
| 11,101,158 B1 * | 8/2021 | Brown | H01L 21/0273 |
| 11,807,523 B2 * | 11/2023 | Chen | B01L 3/0268 |
| 2006/0204699 A1 * | 9/2006 | Maltezos | B81C 99/009 264/317 |
| 2018/0277413 A1 * | 9/2018 | Xia | G03F 7/2059 |

\* cited by examiner

Primary Examiner — Binh X Tran
(74) Attorney, Agent, or Firm — Christopher O. Edwards; Matthew F. Johnston; Trenton J. Roche

(57) ABSTRACT

A structured membrane fabrication method begins with a membrane wafer on a substrate and at least one thin-film on the membrane wafer such that portions of the membrane wafer are exposed. The exposed portions of the membrane wafer and each thin-film are covered with an acetone-inert protectant. Portions of the protectant are etched through to the membrane wafer while each thin-film remains fully covered by the protectant. A handle is coupled to the protectant with a wax that dissolves in acetone. Portions of the substrate are then removed to define and expose a contiguous region of the membrane wafer adjacent to each thin-film and the portions of the protectant so-etched. The wax is exposed to acetone so that it dissolves. The contiguous region of the membrane wafer is then etched through at the portions of the protectant so-etched. The protectant is then removed.

23 Claims, 2 Drawing Sheets

METHOD OF FABRICATING STRUCTURED MEMBRANES

ORIGIN OF THE INVENTION

Figure 1:
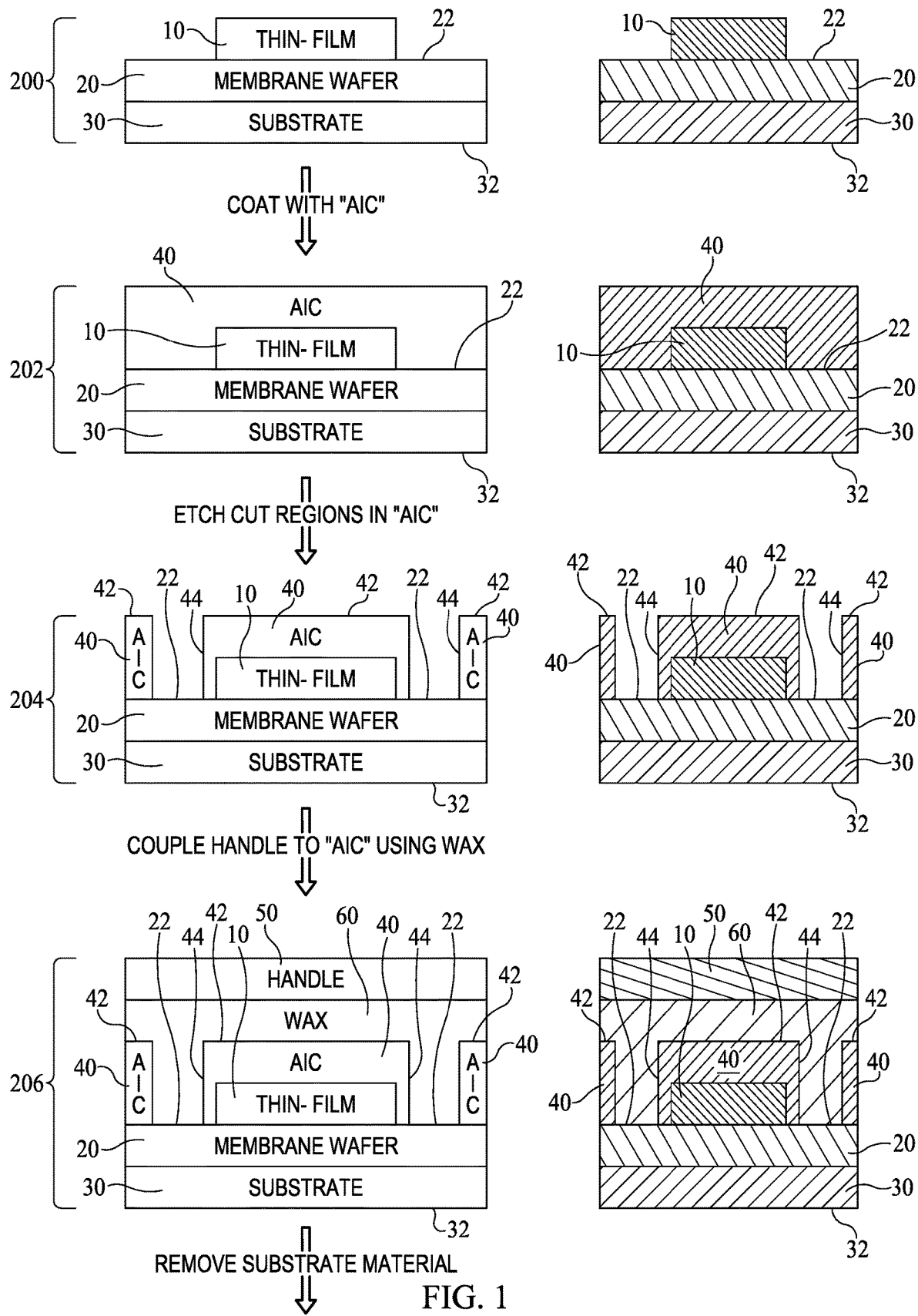
Figure 1:
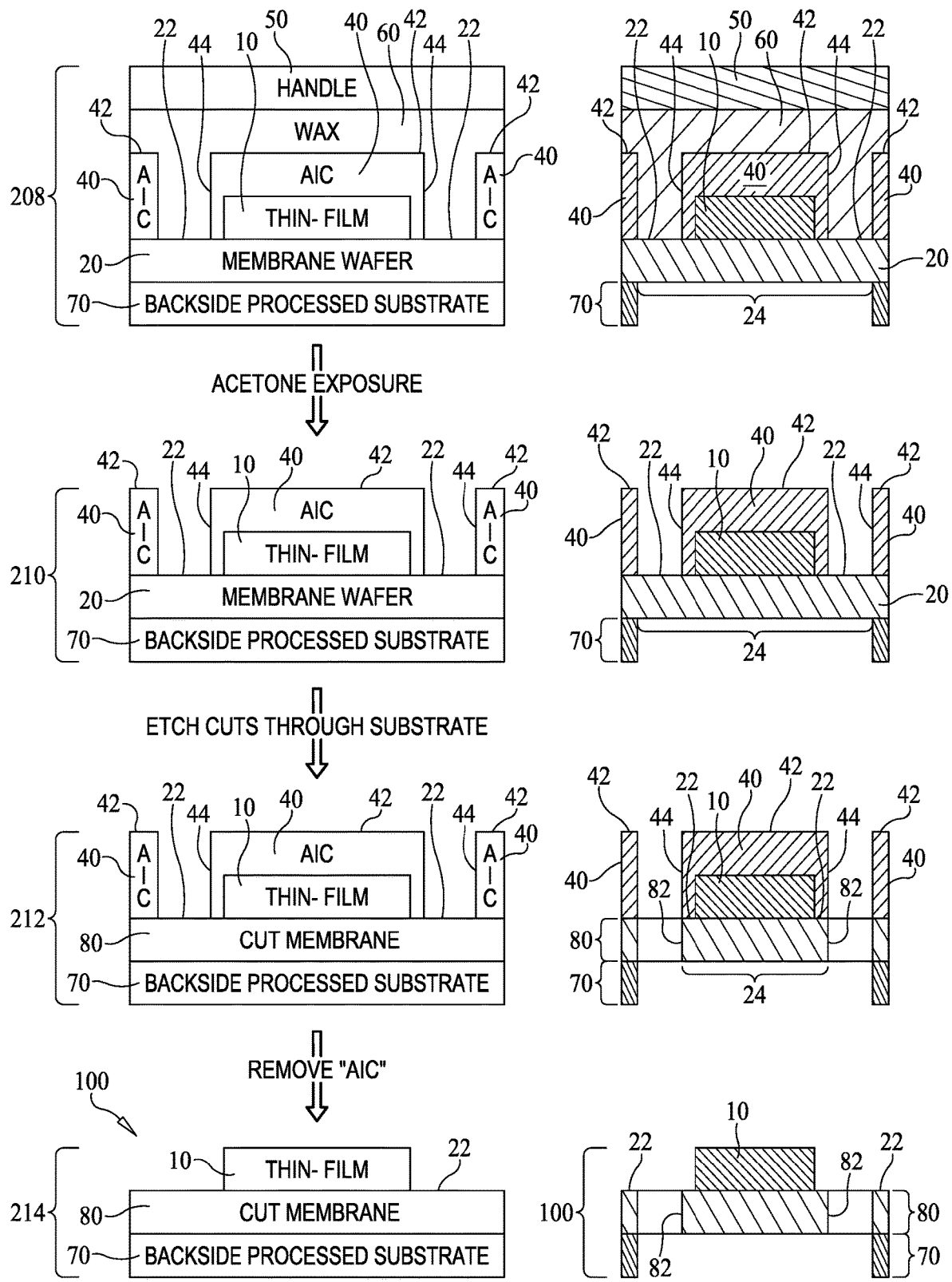

The invention described herein was made in the performance of work under a NASA contract and by an employee of the United States Government and is subject to the provisions of Section 20135(b) of the National Aeronautics and Space Act, Public Law 111-314, § 3 (124 Stat. 3330, 51 U.S.C. Chapter 201), and may be manufactured and used by or for the Government for governmental purposes without the payment of any royalties thereon or therefore.

BACKGROUND OF THE INVENTION

1. Field of the Invention

This invention relates to structured membranes. More specifically, the invention is method of fabricating structured membranes that improves upon existing dry etch and wet etch techniques.

2. Description of the Related Art

Common micromachining/etching techniques used to fabricate structured membranes include dry etching (e.g., deep reactive ion etching, xenon difluoride etching, etc.) and wet etch chemistries (e.g., potassium hydroxide, tetramethylammonium hydroxide, etc.). Conventional structured membrane fabrication procedures use photoresist as an imaging layer on a thin-film material or wafer supported on a substrate.

In accordance with some conventional fabrication procedures, the wafer is etched to define the ultimate membrane's cuts, holes, and/or slots. After the cuts, holes, and/or slots are formed, the etched wafer is temporarily bonded to a handle for mechanical support so that the backside of the supporting substrate can be etched to the membrane or an etch stop. Unfortunately, temporary bonding materials can be carcinogenic. Furthermore, both dry and wet etch methods generally require the use of etch stop materials whose removal can cause damage to the ultimate device being fabricated.

In accordance with some bulk micromachining fabrication procedures, etching of the membrane is postponed until the substrate's backside is processed. However, this requires the use of "hard" metal or oxide masks that require aggressive removal processes that can compromise the mechanical or electrical properties of the ultimate device being fabricated.

SUMMARY OF THE INVENTION

Accordingly, it is an object of the present invention to provide a method of fabricating a structured membrane.

Another object of the present invention is to provide a method of fabricating a structured membrane that avoids drawbacks associated with conventional dry etching and wet etching processes.

Still another object of the present invention is to provide a method of fabricating a structured membrane with cut openings.

Other objects and advantages of the present invention will become more obvious hereinafter in the specification and drawings.

In accordance with the present invention, a structured membrane fabrication method begins with a membrane wafer on a substrate. At least one thin-film is provided on the membrane wafer such that portions of the membrane wafer are exposed. The exposed portions of the membrane wafer and each thin-film are covered with a protectant that is inert in acetone. Portions of the protectant are etched through to the membrane wafer while each thin-film remains fully covered by the protectant. A handle is coupled to the protectant with a wax that dissolves in acetone. Portions of the substrate are removed such that a contiguous region of the membrane wafer is defined and exposed adjacent to each thin-film and the portions of the protectant so-etched. The wax is exposed to acetone so that it dissolves thereby also uncoupling the handle from the protectant. The contiguous region of the membrane wafer is etched through at the portions of the protectant so-etched. The protectant is then removed.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein:

FIG. 1 is a schematic process flow diagram of a method for fabricating a structured membrane with corresponding cross-sectional views of the different stages of an exemplary structure as it is being fabricated in accordance with an embodiment of the present invention.

DESCRIPTION OF THE PREFERRED EMBODIMENT(S)

Referring now to FIG. 1, a process flow diagram is shown for a method of fabricating a structured membrane in accordance with an embodiment of the present invention. Adjacent to each schematically-illustrated process stage in the flow diagram is a cross-sectional view of an exemplary structure as it would appear at that stage of the fabrication process. It is to be understood that the exemplary structure is not a limitation of the present invention and that the various cross-sectional views are not drawn to scale.

The process of the present invention can be used to construct a variety of structured membrane devices such as microelectromechanical systems (MEMS) that incorporate supporting beams, cuts or slots, or holes. In addition, the present invention can be used in to create a variety of cuts in structured membranes, micro or nano membranes, and other types of thin-film structures used in a variety of device applications.

The process of the present invention begins at step 200 with a thin-film material 10 (hereinafter "thin-film 10") disposed on portions of a topside surface 22 of a membrane wafer 20 with membrane wafer 20 being disposed on a substrate 30. In general, membrane wafer 20 is a continuous thin-film sheet of material that will be processed as described herein to become part of a structured membrane. Substrate 30 has a backside surface 32 that is opposite topside surface 22 as would be well-understood in the art. Thin-film 10 is representative of one or more thin-films deposited on surface 22. Thin-film 10 can be a variety of metals (e.g., hafnium, aluminum, gold, niobium, etc.) and non-metals (e.g., semiconductors, dielectrics, etc.) without departing from the scope of the present invention. Thin-film 10 can be patterned in accordance with an application's needs as is well-known in the art.

Membrane wafer 20 is typically a sub-micron to tens of microns thick layer of material such as, but not limited to, silicon, silicon oxide, silicon nitride, aluminum oxide, aluminum nitride, diamond, and combinations thereof. Substrate 30 is generally thicker than membrane wafer 20 and is typically made from silicon. In some embodiments of the present invention, an etch stop material (e.g., silicon dioxide) can be disposed between membrane wafer 20 and substrate 30 as is known in the art. The fabrication techniques used to deposit thin-film 10 onto surface 22 and to pattern thin-film 10 are not limitations of the present invention. In most applications of the present invention, portions of surface 22 will remain exposed after the deposition and patterning of thin-film 10 thereon.

With the provision of thin-film 10 on membrane wafer 20 as described above, a coating 40 is applied at step 202 to cover thin-film 10 and any exposed portions of surface 22. In general, coating 40 is a material that is inert in acetone and will be referred to hereinafter as acetone-inert coating ("AIC") 40. AIC 40 protects both thin-film 10 and surface 22 until its removal at the final stage of the fabrication process. In some embodiments of the present invention, AIC 40 is what is known in the art as an anti-reflective coating of the type used in dry patterning processes. By way of an illustrative example, when membrane wafer 20/substrate 30 is any of the above-described materials and thin-film 10 is hafnium, a suitable choice for AIC 40 is the anti-reflective coating XHRiC that is commercially available from Brewer Science, Rolla, Missouri.

Following the covering of thin-film 10 and surface 22 with AIC 40, cut regions of membrane wafer 20 are defined at step 204 using AIC 40. More specifically, the exposed surface 42 of AIC 40 is patterned (e.g., using a photoresist) to identify cut regions in AIC 40 that can serve as a template for the ultimate cut regions in membrane wafer 20 as will be explained later herein. AIC 40 is etched through to surface 22 in accordance with a cut-region-defining pattern on surface 42 that is indicative of the desired cut pattern for surface 22. As a result, cut regions 44 are created in AIC 40. Creation of cut regions 44 can be achieved by a plasma etch process (e.g., an oxygen plasma etch). During and after the creation of cut regions 44, thin-film 10 remains protected by AIC 40.

Prior to processing substrate 30 from its backside surface 32, the above-described structure must be properly supported for such backside processing. In the present invention as illustrated at step 206, the support is provided by a handle 50 that is coupled to AIC 40 using an acetone-dissolvable wax 60. The particular physical configuration of handle 50 is not a limitation of the present invention. In some embodiments of the present invention, handle 50 is made of an optically-transparent glass to facilitate alignment operations. In general, wax 60 is selected to be dissolvable in acetone. Wax 60 is in contact with AIC surface 42 and fills AIC cut regions 44. In some embodiments of the present invention, a polymer can be used in place of the wax.

With the structure properly supported as described immediately above, step 208 of the process involves removing selected amounts and regions of substrate 30 from backside surface 32 to create a backside processed membrane substrate 70 (referred to hereinafter as BP substrate 70) that still supports membrane 20. The amounts and regions of material removed from substrate 30 via backside surface 32 are dictated by application requirements and are not limitations of the present invention. In general, after substrate 30 is processed to generate BP substrate 70, a contiguous region 24 of membrane wafer 20 is defined and exposed adjacent to thin-film 10 and cut regions 44 of AIC 40. The processes used to create BP substrate 70 can include one or more of ion etching processes, plasma etching processes, and wet etching processes (e.g. using potassium hydroxide) depending on the substrate material. During such processing, it is noted that thin-film 10 and the portions of surface 22 that need to be preserved for the ultimate device remain covered and protected by AIC 40. Furthermore, because no holes have been cut yet in membrane wafer 20, the wet etch material cannot reach surface 22 or thin-film 10.

Following the above-described processing that creates BP substrate 70, handle 50 can be removed. This is accomplished at step 210 by exposing the structure to acetone (e.g., using an acetone bath). During such acetone exposure, wax 60 dissolves thereby removing it and simultaneously uncoupling handle 50 from AIC 40. As a result, cut regions 44 are exposed along with the corresponding exposed portions of surface 22 while thin-film 10 remains protected. As mentioned above, cut regions 44 provide the desired cut pattern for membrane wafer 20.

At step 212, contiguous region 24 of membrane wafer 20 is etched through from surface 22 at cut regions 44 of AIC 40 as thin-film 10 remains protected. As a result, a cut membrane 80 has cuts 82 extending through the membrane's contiguous region 24 and aligned with cut regions 44 of AIC 40. A variety of wet or dry etching process can be used to create cuts 82 without departing from the scope of the present invention. At a final step 214, AIC 40 is removed by, for example, the same type of etching process (e.g., plasma etching) used to create cut regions 44 to thereby yield a structured membrane 100.

The advantages of the present invention are numerous. The protectant-incorporating process preserves the integrity of the ultimate device's elements, while also serving as a patterned mask for creating precise cuts in the device's thin membrane as required for the particular structured membrane. No cuts are made in the membrane wafer until the backside of the supporting substrate is processed. The process can be readily adapted to a variety of micromachining applications widely used throughout government, industry, and academia.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

The invention claimed is:
1. A method comprising the steps of:
providing a membrane wafer on a substrate;
providing at least one thin-film on said membrane wafer wherein portions of said membrane wafer are exposed;
covering said portions of said membrane wafer and each said thin-film with a protectant that is inert in acetone;
etching portions of said protectant through to said membrane wafer, wherein each said thin-film remains fully covered by said protectant;
coupling a handle to said protectant with a wax that dissolves in acetone;
removing portions of said substrate wherein a contiguous region of said membrane wafer is defined and exposed adjacent to each said thin-film and said portions of said protectant so-etched;

exposing said wax to acetone wherein said wax dissolves and said handle is uncoupled from said protectant;

etching through said contiguous region of said membrane wafer at said portions of said protectant so-etched; and removing said protectant.

2. A method according to claim 1, wherein said step of etching portions of said protectant comprises a plasma etching process.

3. A method according to claim 1, wherein said step of removing portions of said substrate from is selected from the group consisting of ion etching processes, plasma etching processes, and wet etching processes.

4. A method according to claim 1, wherein said step of etching through said contiguous region comprises an ion etching process.

5. A method according to claim 1, wherein said step of removing said protectant comprises a plasma etching process.

6. A method according to claim 1, wherein said membrane is selected from the group consisting of silicon, silicon oxide, silicon nitride, aluminum oxide, aluminum nitride, diamond, and combinations thereof.

7. A method according to claim 1, wherein said thin-film is selected from the group consisting of metals and non-metals.

8. A method according to claim 1, wherein said protectant comprises an anti-reflective coating.

9. A method according to claim 1, wherein said handle comprises an optically-transparent glass.

10. A method comprising the steps of:

providing a membrane wafer on a substrate;

providing at least one metal film on said membrane wafer wherein portions of said membrane wafer are exposed;

covering said portions of said membrane wafer and each said metal film with a protectant that is inert in acetone;

etching portions of said protectant through to said membrane wafer, wherein each said metal film remains fully covered by said protectant;

covering said protectant with a wax that dissolves in acetone;

coupling an optically-transparent glass handle to said wax;

removing portions of said substrate wherein a contiguous region of said membrane wafer is defined and exposed adjacent to each said metal film and said portions of said protectant so-etched;

exposing said wax to acetone, wherein said wax dissolves and wherein said protectant is exposed;

etching through said contiguous region of said membrane wafer at said portions of said protectant so-etched; and removing said protectant.

11. A method according to claim 10, wherein said step of etching portions of said protectant comprises a plasma etching process.

12. A method according to claim 10, wherein said step of removing portions of said substrate is selected from the group consisting of ion etching processes, plasma etching processes, and wet etching processes.

13. A method according to claim 10, wherein said step of etching through said contiguous region comprises an ion etching process.

14. A method according to claim 10, wherein said step of removing said protectant comprises a plasma etching process.

15. A method according to claim 10, wherein said membrane is selected from the group consisting of silicon, silicon oxide, silicon nitride, aluminum oxide, aluminum nitride, diamond, and combinations thereof.

16. A method according to claim 10, wherein said protectant comprises an anti-reflective coating.

17. A method comprising the steps of:

providing a membrane wafer on a substrate;

providing at least one metal film on said membrane wafer wherein portions of said membrane wafer are exposed;

covering said portions of said membrane wafer and each said metal film with an anti-reflective coating that is inert in acetone;

etching portions of said anti-reflective coating through to said membrane wafer, wherein each said metal film remains fully covered by said anti-reflective coating;

coupling a handle to said anti-reflective coating using a wax that dissolves in acetone;

removing portions of said substrate wherein a contiguous region of said membrane wafer is defined and exposed adjacent to each said metal film and said portions of said anti-reflective coating so-etched;

exposing said wax to acetone wherein said wax dissolves and said handle is uncoupled from said anti-reflective coating;

etching through said contiguous region of said membrane wafer at said portions of said anti-reflective coating so-etched; and removing said anti-reflective coating.

18. A method according to claim 17, wherein said step of etching portions of said anti-reflective coating comprises a plasma etching process.

19. A method according to claim 17, wherein said step of removing portions of said substrate is selected from the group consisting of ion etching processes, plasma etching processes, and wet etching processes.

20. A method according to claim 17, wherein said step of etching through said contiguous region comprises an ion etching process.

21. A method according to claim 17, wherein said step of removing said anti-reflective coating comprises a plasma etching process.

22. A method according to claim 17, wherein said membrane is selected from the group consisting of silicon, silicon oxide, silicon nitride, aluminum oxide, aluminum nitride, diamond, and combinations thereof.

23. A method according to claim 17, wherein said handle comprises an optically-transparent glass.

\* \* \* \* \*